United States Patent
Yu et al.

(10) Patent No.: US 7,435,638 B2
(45) Date of Patent: Oct. 14, 2008

(54) DUAL POLY DEPOSITION AND THROUGH GATE OXIDE IMPLANTS

(75) Inventors: Shaofeng Yu, Plano, TX (US); Shyh-Horng Yang, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 180 days.

(21) Appl. No.: 11/441,980

(22) Filed: May 26, 2006

(65) Prior Publication Data

US 2007/0275517 A1   Nov. 29, 2007

(51) Int. Cl.
H01L 21/336  (2006.01)
H01L 21/8234  (2006.01)

(52) U.S. Cl. .................. 438/197; 438/157; 438/199

(58) Field of Classification Search ............... 438/157, 438/197, 199, 218, 230
See application file for complete search history.

(56) References Cited

U.S. PATENT DOCUMENTS

| | | | |
|---|---|---|---|
| 5,789,286 A | 8/1998 | Subbanna | |
| 6,261,885 B1 * | 7/2001 | Cheek et al. | 438/199 |
| 6,881,631 B2 * | 4/2005 | Saito et al. | 438/283 |
| 2006/0099812 A1 | 5/2006 | Krull | |

OTHER PUBLICATIONS

Murarka, et al. "Electronic materials: science and technology" Academic Press, 1989, pp. 234-235 and 239, ISBN 0125111207, San Diego.

* cited by examiner

*Primary Examiner*—Phuc T Dang
(74) *Attorney, Agent, or Firm*—Frederick J. Telecky, Jr.; Wade J. Brady, III

(57) ABSTRACT

Dopants are implanted at relatively high energies into an unmasked first region of a semiconductor substrate through a thin layer of gate electrode material and a gate dielectric layer. Lower energy dopants are then implanted into the thin layer of gate electrode material. The first region is then masked off, and the process is repeated in a previously masked, but now unmasked, second region of the semiconductor substrate. A second (and usually thicker) layer of gate electrode material is then formed over the thin layer of gate electrode material. The layer of thick gate electrode material, the layer of thin gate electrode material and the layer of gate dielectric material are patterned to form one or more gate structures over the doped regions of the substrate. Source and drain regions are formed in the substrate regions adjacent to the gate structures to establish one or more MOS transistors.

16 Claims, 6 Drawing Sheets

DUAL POLY DEPOSITION AND THROUGH GATE OXIDE IMPLANTS

FIELD OF INVENTION

The present invention relates generally to semiconductor processing, and more particularly to performing a dual poly deposition, implanting dopants through a gate oxide, and dual pre-pattern poly doping.

BACKGROUND OF THE INVENTION

It can be appreciated that semiconductor processing can comprise hundreds of steps, during which many copies of an integrated circuit can be formed on a single semiconductor substrate or workpiece, generally known as a wafer. Generally, such processes involve creating several layers on and in the substrate that ultimately form a complete integrated circuit. This layering process can create electrically active regions in and on the semiconductor wafer surface. In a metal-oxide-semiconductor (MOS) transistor, for example, a gate structure is created, which can be energized to establish an electric field within a semiconductor channel, by which current is enabled to flow between a source region and a drain region within the transistor. The source and drain regions facilitate this conductance by virtue of containing a majority of hole (p type) or electron (n type) carriers.

It can also be appreciated that there is an ongoing desire to streamline fabrication processes to reduce fabrication times and cut costs. Likewise, it is desirable to enhance transistor operation. Accordingly, techniques that allow MOS transistors to be fabricated in a cost effective manner, while also improving the functionality of resulting transistors are desirable.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

Implantations of one or more types of dopants to form one or more MOS transistors are performed through a thin layer of gate electrode material and a layer of gate dielectric material. Additionally, dopants are implanted into the thin layer of gate electrode material, where at least some of this layer serves as a lower portion of a gate electrode of a transistor. Locating the dopants in this part of the gate electrode enhances the operation of the transistor by mitigating the likelihood of poly depletion, for example. These two implantations are performed using the same mask which reduces the number of masking steps needed and thereby streamlines the fabrication process.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

An exemplary methodology 100 for forming one or more MOS transistors is illustrated in FIG. 1, and FIGS. 2-11 are cross sectional views of a semiconductor substrate 200 wherein such a method is implemented. While the method 100 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated acts may be required to implement a methodology disclosed herein. Further, one or more of the acts depicted herein may be carried out in one or more separate acts and/or phases.

Figure 1:
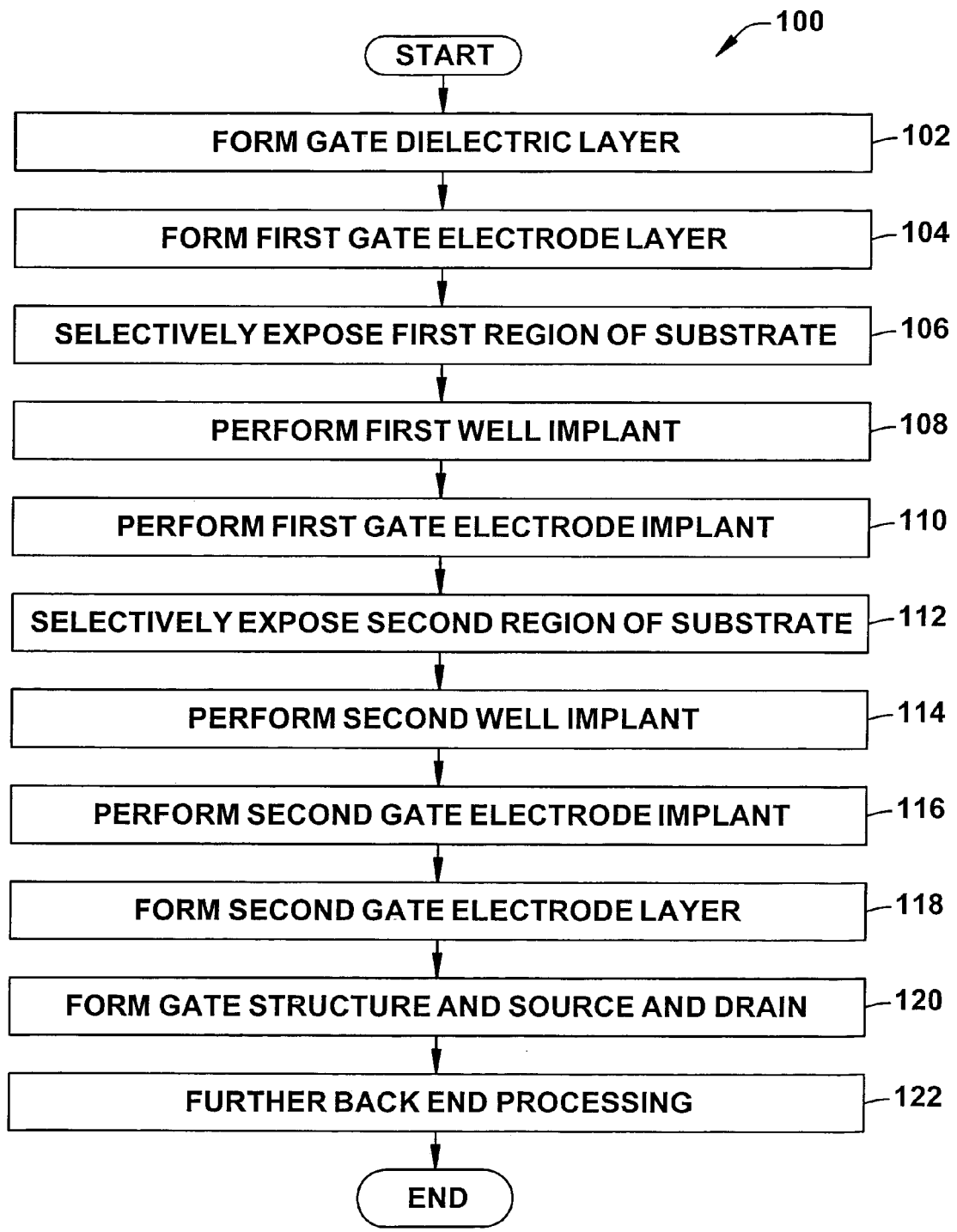
FIG. 1 is a flow diagram illustrating an exemplary methodology for forming one or more MOS transistors.
Figure 2:
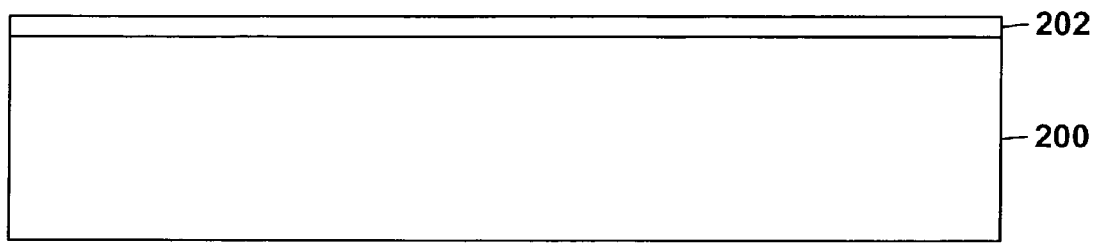
FIGS. 2-11 are cross-sectional views of a semiconductor substrate wherein one or more exemplary MOS transistors are formed.

The methodology 100 begins at 102 wherein a layer of gate dielectric material 202 is formed over a semiconductor substrate 200 (FIG. 2). Although not illustrated, it will be appreciated that isolation regions (e.g., STI) can be formed in the substrate 200 prior to forming the layer of gate dielectric material 202. Such isolation regions are formed at select locations in the substrate 200, and serve to separate structures from one another, such as resulting transistors, for example. It will be appreciated that substrate as referred to herein may comprise any type of semiconductor body (e.g., silicon, SiGe, SOI) such as a semiconductor wafer or one or more die on a wafer, as well as any other type of semiconductor and/or epitaxial layers grown thereon and/or otherwise associated therewith. The layer of gate dielectric material 202 can be formed to a thickness of about 1 nanometer or more, and can have an equivalent oxide thickness (EOT) of between about 3 nanometers and about 0.5 nanometers, for example. The layer of gate dielectric material 202 can comprise a high-k dielectric material, for example. A dielectric material having a k of about 7.8 and a thickness of about 10 nm, for example, is substantially electrically equivalent to an oxide gate dielectric having a k of about 3.9 and a thickness of about 5 nm. The layer of gate dielectric material 202 may include, for example, any one or more of the following, either alone or in combination: aluminum oxide ($Al_2O_3$), zirconium silicate, hafnium silicate, hafnium silicon oxynitride, hafnium oxynitride, zirconium oxynitride, zirconium silicon oxynitride, hafnium silicon nitride, lanthanum oxide ($La_2O_3$), hafnium oxide ($HfO_2$), zirconium oxide ($ZrO_2$), cerium oxide ($CeO_2$), bismuth silicon oxide ($Bi_4Si_2O_{12}$), titanium dioxide ($TiO_2$), tantalum oxide ($Ta_2O_5$), tungsten oxide ($WO_3$), yttrium oxide ($Y_2O_3$), lanthanum aluminum oxide ($LaAlO_3$), barium strontium titanate, barium strontium oxide, barium titanate, strontium titanate, $PbZrO_3$, PST, PZN, PZT and PMN.

Figure 3:
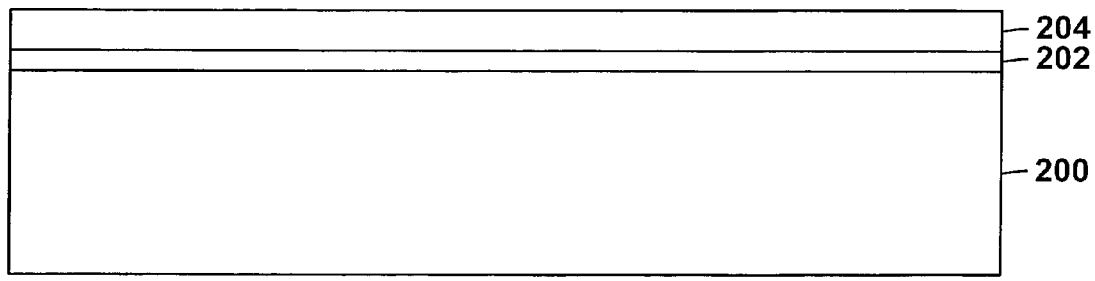

A first layer of gate electrode material 204 is then formed over the layer of gate dielectric material 202 at 104 (FIG. 3). This layer of gate electrode material 204 may be formed to a thickness of between about 80 Angstroms and about 300 Angstroms, for example. The first layer of gate electrode material 204 generally includes polysilicon, SiGe or other semiconductor materials. It will be appreciated that the layer of gate dielectric material 202 and the first layer of gate electrode material 204 can be applied to the substrate 200 in any number of ways, such as with spin-on techniques, sputtering techniques (e.g., magnetron or ion beam sputtering), growth and/or deposition techniques such as chemical vapor deposition (CVD), for example.

Figure 4:
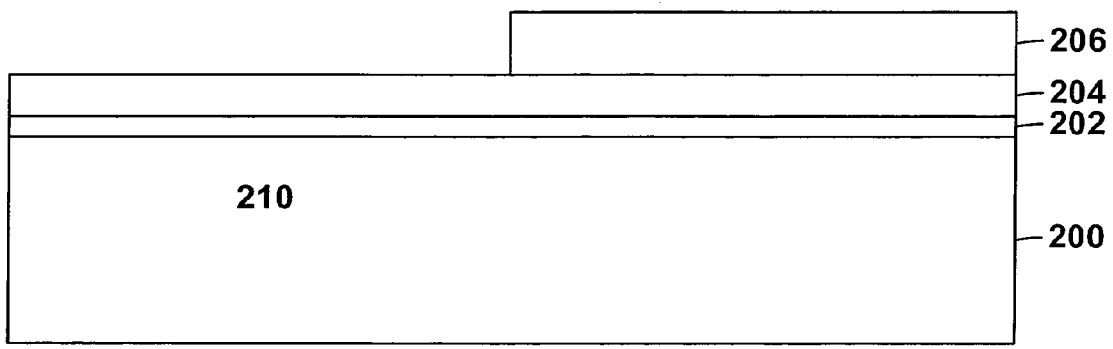

At 106 part of the substrate is masked off so that one or more dopants can be selectively implanted into a first unmasked area of the substrate. For example, a first resist 206 can be formed over the entire substrate 200 and patterned in accordance with lithographic techniques so that an exposed portion 210 of the substrate 200, wherein a first type of transistor is to be formed, can be doped to form a first well therein (FIG. 4). The first resist 206 is formed to a thickness sufficient to block subsequently implanted dopants. For example, the first resist can be formed to a thickness of between about 500 nanometers and about 1500 nanometers. It will be appreciated that lithography can be implemented to effect much of the patterning and processing described herein, where lithography broadly refers to processes for transferring one or more patterns between various media. In lithography, a light sensitive resist coating is formed over one or more layers to which a pattern is to be transferred. The resist coating is then patterned by exposing it to one or more types of radiation or light which (selectively) passes through an intervening lithography mask containing the pattern. The light causes exposed or unexposed portions of the resist coating to become more or less soluble, depending on the type of resist used. A developer is then used to remove the more soluble areas leaving the patterned resist. The patterned resist can then serve as a mask for the underlying layer or layers which can be selectively treated (e.g., doped).

Figure 5:
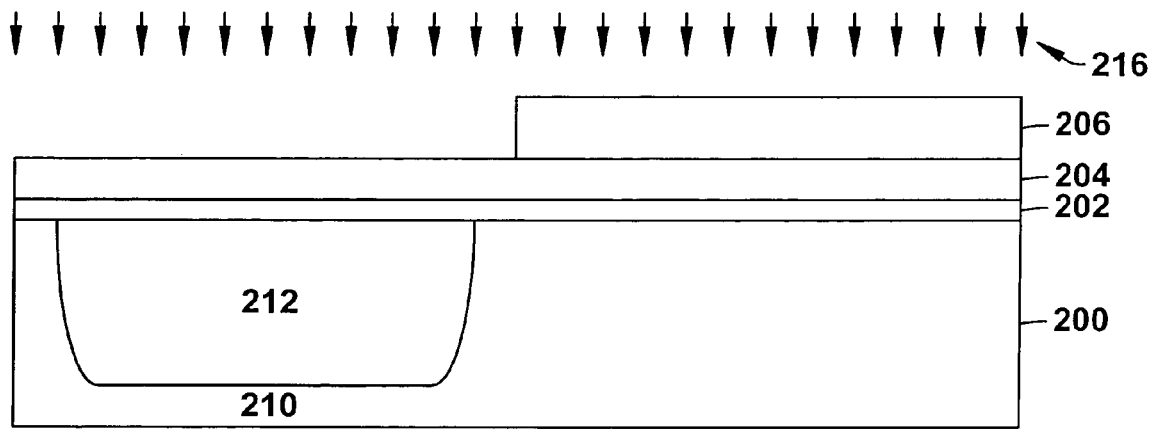

Accordingly, at 108 a first implantation 216 is performed to implant dopants into the first unmasked region 210 of the substrate 200 (FIG. 5). It will be appreciated that this implantation 216 may actually comprise one or more implantations performed at one or more doses and/or energies with one or more different species. The implanted dopants have a first electrical conductivity type so that the first well 212 possesses the first electrical conductivity type. By way of example, the dopants may be p type dopants so that the first well 212 has a p type electrical conductivity. As such, one or more NMOS transistors can be formed in the first region 210. The implantation 216 is performed in such a manner that the dopants pass through the first layer of gate electrode material 204 and the layer of gate dielectric material 202. For example, Boron can be implanted at a dose of between about $1e12/cm^2$ and about $3e13/cm^2$ and an energy of between about 20 KeV and about 300 KeV.

Figure 6:
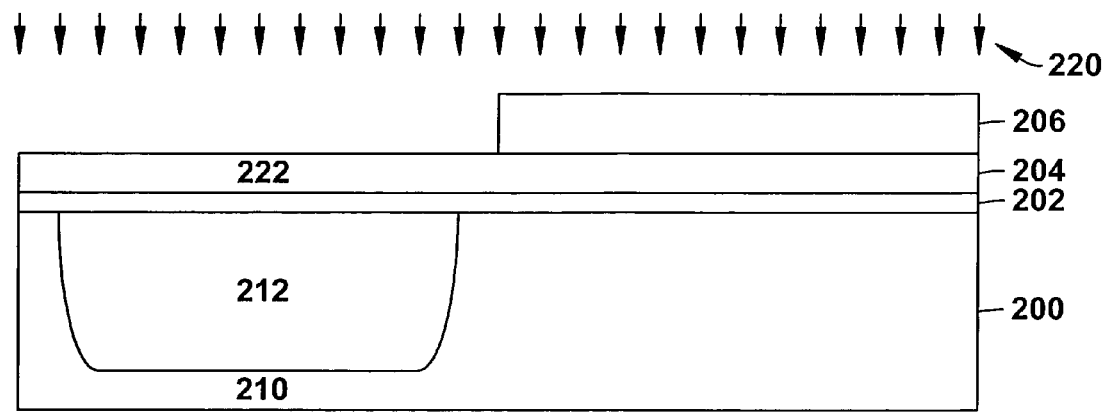
Figure 7:
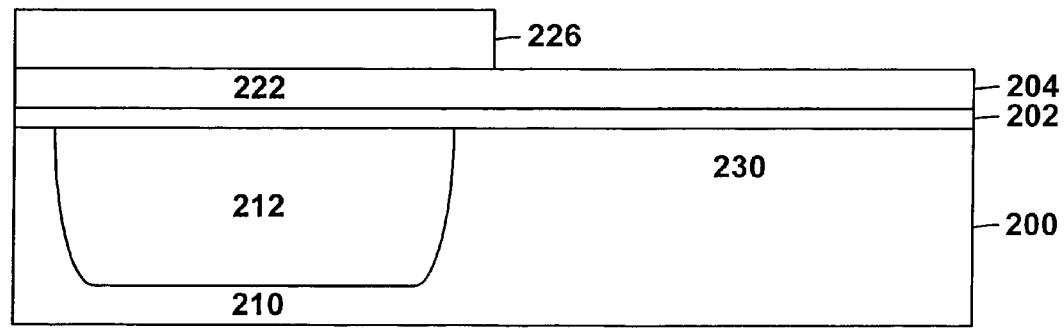

At 110, a second implantation 220 is performed to implant dopants having the first electrical conductivity type into a first region 222 of the first layer of gate electrode material 204 overlying the first region 210 of the substrate 200, where these dopants generally do not penetrate into and/or are stopped by the layer of gate dielectric material 202 (FIG. 6). By way of example, Arsenic can be implanted at a dose of between about $1e15/cm^2$ and about $4e15/cm^2$ and an energy of between about 500 eV and about 2.5 KeV. Additionally, this implantation may comprise one or more implantations performed at one or more doses and/or energies with one or more different species. At 112, the first patterned resist 206 is stripped and a second resist 226 is formed and patterned so that a second region 230 of the substrate 200 is unmasked and a second well 232 can be formed therein (FIG. 7). Similar to resist 206, the second resist 226 is formed to a thickness (e.g., between about 500 nanometers and about 1500 nanometers) sufficient to block subsequently implanted dopants.

Figure 8:
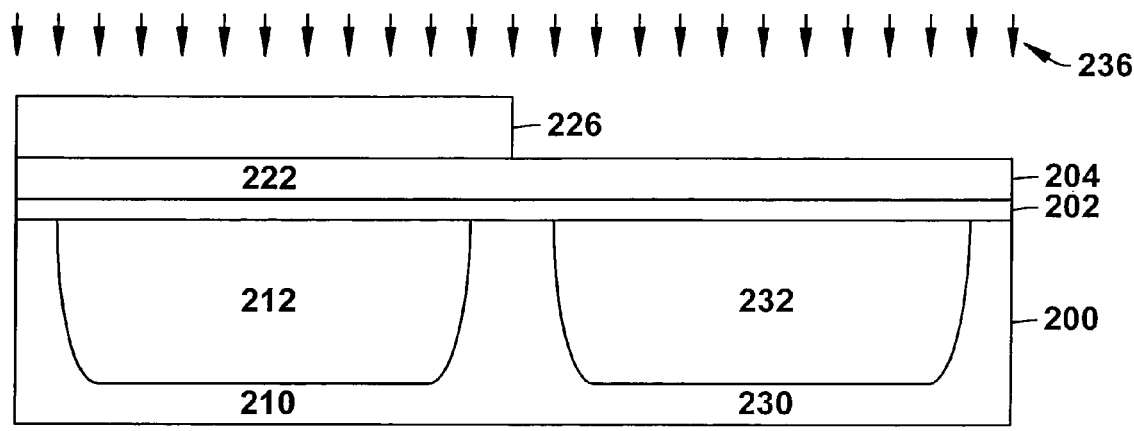

A third implantation 236 is thus performed at 114 to establish the second well 232 in the second region 230 of the substrate 200 (FIG. 8). The implanted dopants have a second electrical conductivity type so that the second well 232 possesses the second electrical conductivity type. By way of example, the dopants may be n type dopants so that the second well 232 has an n type electrical conductivity. As such, one or more PMOS transistors can be formed in the second region 230. Like implantation 216, implantation 236 is performed so that the dopants pass through the first layer of gate electrode material 204 and the layer of gate dielectric material 202. For example, Phosphorus can be implanted at a dose of between about $1e12/cm^2$ and about $3e13/cm^2$ and an energy of between about 60 KeV and about 500 KeV. Similarly, this implantation 236 may comprise one or more implantations performed at one or more doses and/or energies with one or more different species.

Figure 9:
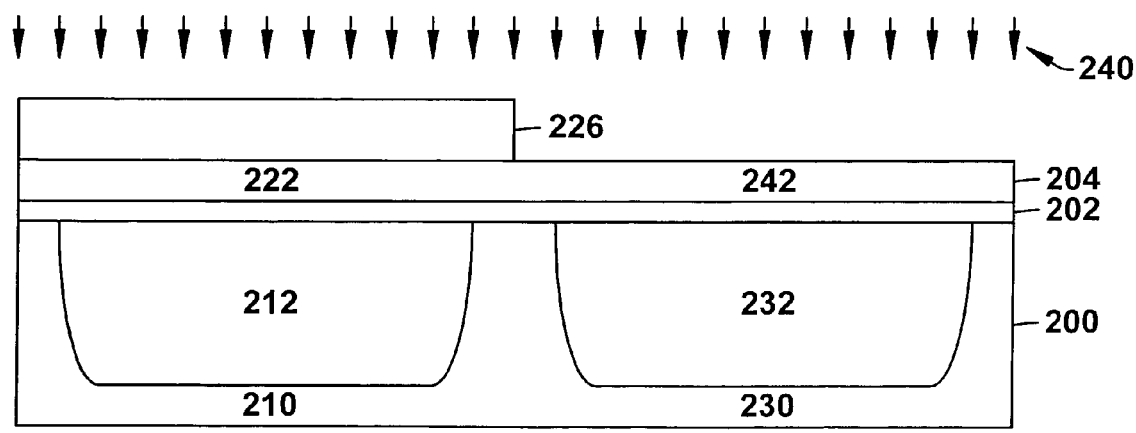

At 116, a fourth implantation 240 is performed to implant dopants having the second electrical conductivity type into a second region 242 of the first layer of gate electrode material 204 overlying the second region 230 of the substrate 200, where these dopants generally do not penetrate into and/or are stopped by the layer of gate dielectric material 202 (FIG. 9). By way of example, BF2 can be implanted at a dose of between about $1e15/cm^2$ and about $4e15/cm^2$ and an energy of between about 500 eV and about 4 KeV. Additionally, this implantation may comprise one or more implantations performed at one or more doses and/or energies with one or more different species.

Figure 10:
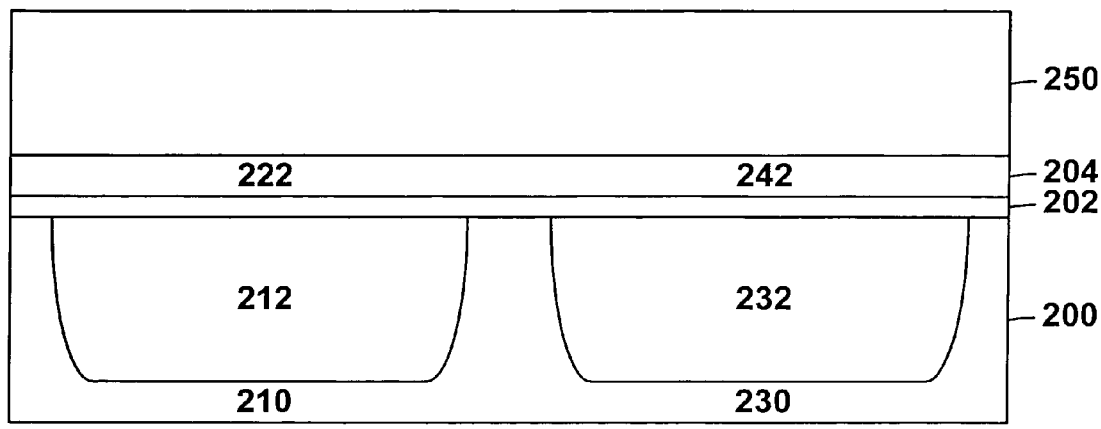

The second patterned resist 226 is then stripped and a second layer of gate electrode material 250 is formed over the first layer of gate electrode material 204 at 118 (FIG. 10). The second layer of gate electrode material 250 may be formed to a thickness of between about 800 Angstroms and about 1000 Angstroms, for example. Like the first layer of gate electrode material 204, the second layer of gate electrode material 250 generally includes polysilicon, SiGe or other semiconductor materials. The second layer of gate electrode material 250 is generally formed by a blanket deposition process wherein masking is not implemented.

Figure 11:
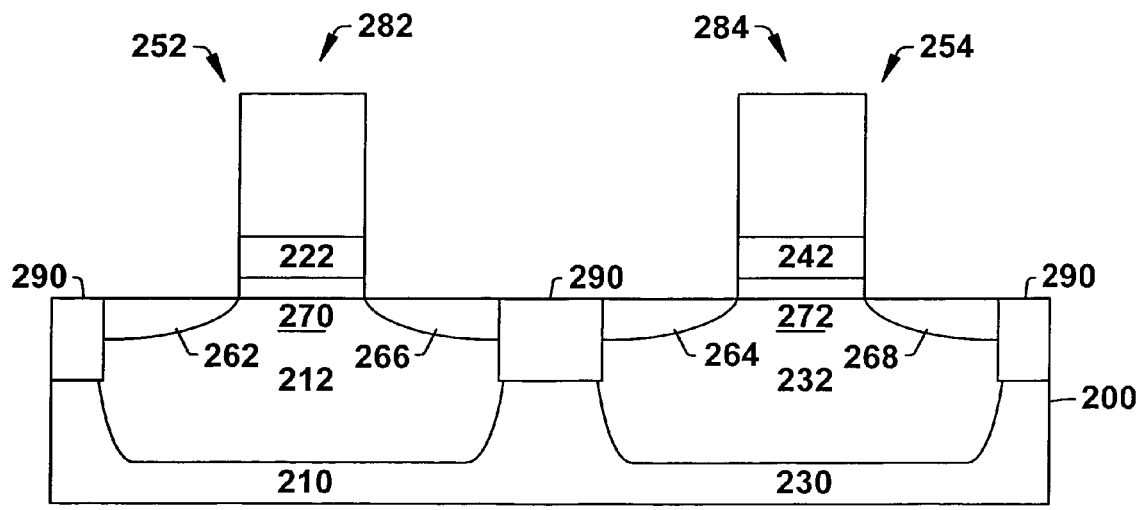

The second layer of gate electrode material 250, the first layer of gate electrode material 204 and the layer of gate dielectric material 202 are then patterned at 120 to form one or more gate structures 252, 254 over the first 210 and second 230 regions, respectively, of the substrate 200 (FIG. 11). The bottom portions 222, 242 of the gate structures 252, 254 thus have a dopant concentration of between about $1e21/cm^2$ and about $4e21/cm^2$. With the patterned gate structures 252, 254 formed, LDD, or other source drain extension implants (not shown) can be performed, for example, depending upon the type(s) of transistors to be formed, and one or more left and right offset and/or sidewall spacers (not shown) can be formed along left and right lateral sidewalls of the patterned gate structures 252, 254.

Implants to form respective source 262, 264 and drain 266, 268 regions are then performed, wherein any suitable masks and implantation processes may be used in forming the source and drain regions to achieve desired transistor types (FIG. 11). It will be appreciated that respective channel regions 270, 272 are thus defined between the source and drain regions 262, 266 and 264, 268 of the different transistors 282, 284. It will also be appreciated that sidewall spacers generally serve to guide dopants into select locations in the substrate 200, such as in forming the source 262, 264 and drain 266, 268 regions, for example.

The transistors 282, 284, and more particularly the first 210 and second 230 regions of the substrate 200 and the first 212 and second 232 wells contained therein, are electrically separated from one another by one or more (previously formed) isolation (e.g., dielectric) regions 290 formed in the substrate

200. In the illustrated example, a single transistor 282 is formed over the first region 210 and a single transistor 284 is formed over the second region 230. It will be appreciated, however, that any number of transistors (including none/zero transistors) can be formed in either of the different regions 210, 230. Once the source/drain regions are formed, the methodology 100 advances to 122, and ends thereafter, wherein further back end processing can be performed at 122, such as the formation and/or patterning of one or more additional conductive and/or non-conductive layers.

It can be appreciated that the gate structures 252, 254 thus comprise respective gate electrodes 222, 250 and 242, 250 and gate dielectrics 202. It will be appreciated that the gate electrodes yield a contact area or surface that provides a means for applying a voltage to the transistors 282, 284 or otherwise biasing the transistors 282, 284. The gate dielectrics generally serve to prevent large 'leakage' currents from flowing from the conductive gate electrodes into the conductive channel regions 270, 272 when voltages are applied to electrodes, while also allowing applied gate voltages to set up electric fields within the channel regions 270, 272 in a controllable manner.

It will be appreciated that the operation of the transistors 282, 284, and in particular current flowing therein, is also a function of the doping of the gate electrodes. In some instances the gate electrodes run out of or become depleted of dopants or electrical carriers. If this happens, the transistors do not function as desired. This depletion is often a function of the location of the dopants within the electrodes, and more particularly because the dopants are located too far away from the channel regions. Accordingly, because dopants are implanted (e.g., at 110/220 and 116/240) in the thin layer of gate electrode material 204, and thus closer to the channel regions 270, 272, transistors fashioned as described herein function in a more desirable manner than transistors that do not have a high concentration of dopants in a bottom portion (e.g., 222, 242) of their gate electrodes (at least relative to the upper portions of their gate electrodes). In particular, transistors fashioned as described herein are less likely to experience gate electrode (e.g., polysilicon) depletion.

Additionally, forming transistors as described herein streamlines the fabrication process, at least, by reducing the number of masks that are needed. In particular, since dopants are implanted through the gate dielectric 202 and first gate electrode 204 at 108/216 and 114/236 to form the first 212 and second 232 wells, merely two masks 206, 226 are needed. However, more masks (e.g., four) are needed if the wells are not formed by implanting through the gate dielectric 202 and the first gate electrode 204 layer. For example, first and second masks would be needed to establish the first 212 and second 232 wells. Additionally, third and fourth masks would also be needed to then dope the single layer of gate electrode material (e.g., where one thick layer of gate electrode material is utilized as opposed to a thin layer 204 and a thicker layer 250 as described herein). Further, since the dopants are applied directly to the bottom portions 222, 242 of the transistors 282, 284, an annealing or other heat treatment process is not needed to force the dopants down toward the bottom of the single thick gate electrode layer, thus substantially lessening a required thermal budget. Also, implanting directly into the lower portion of the gate electrode provides a much greater degree of control over where the dopants ultimately end up in the gate electrode, particularly as compared to heating the dopants to move them around.

Implanting dopants through the (thin) layer of gate electrode material 204 to form the first 212 and second 232 wells also allows a much lower energy to be used to implant the dopants, as compared to having to implant the dopants thorough a single thicker layer of gate electrode material. Using lower energy implants is more desirable as it is less destructive (e.g., to the gate dielectric layer). Implanting through the thinner layer of gate electrode material 204 also allows more control over the implantation process, such as to achieve a retrograde profile, for example, where a retrograde profile refers to a concentration of dopants that increases in relation to implantation depth (e.g., dopant concentration increases as depth increases). It will be appreciated that achieving a retrograde profile is desirable since such a dopant distribution allows for desired device performance.

In one example, a retrograde profile in a transistor fashioned as described herein comprises a dopant of Arsenic at a concentration of between about $1e18/cm^3$ and about $2e18/cm^3$ at a depth of between about 200 Angstroms and about 400 Angstroms and having a concentration that is reduced to between about $1e18/cm^3$ and about $3e17/cm^3$ as the implantation depth is reduced to between about 0 Angstroms and about 100 Angstroms. Stated another way, a higher dopant concentration is produced deeper in the substrate, while a lighter dopant concentration is produced at shallower locations in the substrate. The deeper dopant concentration is thus between about $1e18/cm^3$ and about $2e18/cm^3$ at a depth of between about 200 Angstroms and about 400 Angstroms, whereas the dopant concentration is merely between about $1e18/cm^3$ and about $3e17/cm^3$ at a depth of between about 0 Angstroms and about 100 Angstroms. It can be appreciated that a retrograde profile is difficult to achieve when implanting through a thick layer of gate electrode material since the dopants are slowed down by the thickness of the layer.

Implanting through the (thin) layer of gate electrode material 204 also allows more uniform implantations to be achieved (e.g., a consistent retrograde profile across the substrate). Implanting through a thick layer of gate electrode material can result in non-uniform implantations as the trajectory of the dopants can be interfered with by the by the thick layer. Additionally, a thicker layer of gate electrode material is more likely to embody non-uniformities and/or undulations than the thin layer of gate electrode material 204 which can be formed more precisely. And, such imperfections may be reflected in or transferred to the implanted dopants. For example, dips in a thick layer of gate electrode material may allow dopants to be implanted more deeply, while elevated portions of a thick layer of gate electrode material may cause dopants to be implanted less deeply.

It will be appreciated that while reference is made throughout this document to exemplary structures in discussing aspects of methodologies described herein (e.g., those structures presented in FIGS. 2-11 while discussing the methodology set forth in FIG. 1), that those methodologies are not to be limited by the corresponding structures presented. Rather, the methodologies (and structures) are to be considered independent of one another and able to stand alone and be practiced without regard to any of the particular aspects depicted in the FIGS.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" is merely meant to mean an example, rather than the best. It is also to be appreciated that features and/or elements depicted herein are illustrated with particular dimensions relative to one another (e.g., layer to layer dimensions, orientations and/or scaling) for purposes of simplicity and ease of understanding, and that actual dimensions of the elements may differ substantially from that illustrated herein.

What is claimed is:

1. A method of forming one or more MOS transistors comprising:
    forming a layer of gate dielectric material over a semiconductor substrate;
    forming a first layer of gate electrode material over the layer of gate dielectric material;
    performing a first implantation of one or more dopants of a first electrical conductivity type through the first layer of gate electrode material and the layer of gate dielectric material, and into a first region of the substrate to establish a first well having the first electrical conductivity type;
    performing a second implantation of one or more dopants of the first electrical conductivity type into a first region of the first layer of gate electrode material, where the first region of the first layer of gate electrode material is located above the first region of the substrate;
    performing a third implantation of one or more dopants of a second electrical conductivity type through the first layer of gate electrode material and the layer of gate dielectric material, and into a second region of the substrate to establish a second well having the second electrical conductivity type;
    performing a fourth implantation of one or more dopants of the second electrical conductivity type into a second region of the first layer of gate electrode material, where the second region of the first layer of gate electrode material is located above the second region of the substrate;
    forming a second layer of gate electrode material over the first layer of gate electrode material;
    patterning the second layer of gate electrode material, the first layer of gate electrode material and the layer of gate dielectric material to form a gate structure over at least one of the first region of the substrate and the second region of the substrate; and
    forming source and drain regions in at least one of the first region of the substrate and the second region of the substrate.

2. The method of claim 1 further comprising:
    masking off the second region of the substrate during at least one of the first and second implantations; and
    masking off the first region of the substrate during at least one of the third and fourth.

3. The method of claim 2, where at least one of:
    the dopants implanted into the first region of the first layer of gate electrode material are implanted at a lower energy but at a higher dose than the dopants implanted into the first region of the substrate;
    the dopants implanted into the second region of the first layer of gate electrode material are implanted at a lower energy but at a higher dose than the dopants implanted into the second region of the substrate; and
    at least one of
        the first implantation, the second implantation, the third implantation and the fourth implantation comprise one or more implantations performed at one or more doses and/or energies with one or more different species.

4. The method of claim 3, where the first implantation comprises:
    implanting Boron at a dose of between about 1e12/cm2 and about 3e13/cm2 at an energy of between about 20 KeV and about 300 KeV.

5. The method of claim 4, where the second implantation comprises:
    implanting Arsenic at a dose of between about 1e15/cm2 and about 4e15/cm2 at an energy of between about 500 eV and about 2.5 KeV.

6. The method of claim 5, where the third implantation comprises:
    implanting Phosphorus at a dose of between about 1e12/cm2 and about 3e13/cm2 at an energy of between about 60 KeV and about 500 KeV.

7. The method of claim 6, where the fourth implantation comprises:
    implanting BF2 at a dose of between about 1e15/cm2 and about 4e15/cm2 at an energy of between about 500 eV and about 4 KeV.

8. The method of claim 7, where at least one of
    performing the first implantation comprises forming the first well to have a retrograde profile, and
    performing the third implantation comprises forming the second well to have a retrograde profile.

9. The method of claim 7, where at least one of performing the first implantation comprises forming the first well to have a retrograde profile of a dopant of Arsenic at a concentration of between about 1e18/cm3 and about 2e18/cm3 at a depth of between about 200 Angstroms and about 400 Angstroms and a concentration of between about 3e17/cm3 and about 1e18/cm3 at a depth of between about 0 Angstroms and about 100 Angstroms, and
    performing the third implantation comprises forming the second well to have a retrograde profile of a dopant of Boron at a concentration of between about 1e18/cm3 and about 2e18/cm3 at a depth of between about 200 Angstroms and about 400 Angstroms and a concentration of between about 3e17/cm3 and about 1e18/cm3 at a depth of between about 0 Angstroms and about 100 Angstroms.

10. The method of claim 2, where the first gate electrode is formed to a thickness of between about 80 Angstroms and about 300 Angstroms and the second gate electrode is formed to a thickness of between about 800 Angstroms and about 1000 Angstroms.

11. The method of claim 9, where the first gate electrode is formed to a thickness of between about 80 Angstroms and about 300 Angstroms and the second gate electrode is formed to a thickness of between about 200 Angstroms and about 1000 Angstroms.

12. A method of forming one or more MOS transistors comprising;
    forming a layer of gate dielectric material over a semiconductor substrate;
    forming a first layer of gate electrode material over the layer of gate dielectric material;
    performing a first implantation of one or more dopants through the first layer of gate electrode material and the layer of gate dielectric material, and into the substrate to establish a well;

performing a second implantation of one or more dopants into the first layer of gate electrode material;

forming a second layer of gate electrode material over the first layer of gate electrode material;

patterning the second layer of gate electrode material, the first layer of gate electrode material and the layer of gate dielectric material to form a gate structure over the substrate; and forming source and drain regions in the substrate.

13. The method of claim 12, where the dopants implanted into the first layer of gate electrode material are implanted at a lower energy but at a higher dose than the dopants implanted into the substrate.

14. The method of claim 13, where at least one of the first implantation comprises implanting Boron at a dose of between about 1e12/cm2 and about 3e13/cm2 at an energy of between about 20 KeV and about 300 KeV, the second implantation comprises implanting Arsenic at a dose of between about 1e15/cm2 and about 4e15/cm2 at an energy of between about 500 eV and about 2.5 KeV, and the first implantation comprises forming the well to have a retrograde profile.

15. The method of claim 14, where at least one of the first implantation and the second implantation comprise one or more implantations performed at one or more doses and/or energies with one or more different species.

16. The method of claim 15, where the first gate electrode is formed to a thickness of between about 80 Angstroms and about 300 Angstroms and the second gate electrode is formed to a thickness of between about 800 Angstroms and about 1000 Angstroms.

* * * * *